United States Patent
He et al.

(10) Patent No.: US 9,796,884 B2
(45) Date of Patent: Oct. 24, 2017

(54) ANISOTROPIC CONDUCTIVE ADHESIVE FILM AND ELECTRONIC DEVICE

(71) Applicants: BOE TECHNOLOGY GROUP CO., LTD., Beijing (CN); CHENGDU BOE OPTOELECTRONICS TECHNOLOGY CO., LTD.

(72) Inventors: Wei He, Beijing (CN); Junping Bao, Beijing (CN); Xinghua Li, Beijing (CN); Seung Yik Park, Beijing (CN)

(73) Assignees: BOE TECHNOLOGY GROUP CO., LTD. (CN); CHENGDU BOE OPTOELECTRONICS TECHNOLOGY CO., LTD. (CN)

( * ) Notice: Subject to any disclaimer, the term of this patent is extended or adjusted under 35 U.S.C. 154(b) by 338 days.

(21) Appl. No.: 14/101,661

(22) Filed: Dec. 10, 2013

(65) Prior Publication Data

US 2014/0170381 A1    Jun. 19, 2014

(30) Foreign Application Priority Data

Dec. 14, 2012 (CN) .......................... 2012 1 0546247

(51) Int. Cl.
*C09J 9/02* (2006.01)
*C09J 7/02* (2006.01)
(Continued)

(52) U.S. Cl.
CPC ............. *C09J 7/026* (2013.01); *C09J 7/0239* (2013.01); *C09J 9/02* (2013.01); *H01L 24/29* (2013.01);
(Continued)

(58) Field of Classification Search
CPC ... Y10T 428/2984; C09J 7/026; C09J 7/0239; C09J 9/02; H01L 24/29; H01L 2924/0665; H01L 2924/07811
See application file for complete search history.

(56) References Cited

U.S. PATENT DOCUMENTS 5,958,176 A * 9/1999 Isshiki ................... C08L 83/04
156/329
7,220,785 B2 5/2007 Saito
(Continued)

FOREIGN PATENT DOCUMENTS

CN 1551320 A 12/2004
CN 101146885 A 3/2008
(Continued)

OTHER PUBLICATIONS

Chinese Second Office Action dated Mar. 28, 2014, Application No. 201210546247.4, 6 Pages.
(Continued)

*Primary Examiner* — William P Watkins, III
(74) *Attorney, Agent, or Firm* — Brooks Kushman P.C.

(57) ABSTRACT

The invention provides an anisotropic conductive adhesive film and an electronic device. The anisotropic conductive adhesive film comprises a base film and microcapsule structures, wherein the microcapsule structures are set on the base film, and each of the microcapsule structures comprises a metallic conductive particle, a normal-temperature curable macromolecular polymer coated on the outside of the metallic conductive particle and a microcapsule wall coated on the outside of the macromolecular polymer, and an adhesive glue is adhered to the external surface of the microcapsule wall. When in use, the microcapsule structure is destroyed by pressurizing, the conductive particle and the normal-temperature curable macromolecular polymer contained inside the microcapsule wall leak out, and the normal-
(Continued)

temperature curable macromolecular polymer leaked out is cured, so that electrical conduction and connection of a microelectronic apparatus can be achieved at normal temperature via the anisotropic conductive adhesive film.

19 Claims, 3 Drawing Sheets

(51) Int. Cl.
    *H01L 23/00*     (2006.01)
    *C08K 9/08*     (2006.01)
    *C08K 9/10*     (2006.01)

(52) U.S. Cl.
    CPC .................. *C08K 9/08* (2013.01); *C08K 9/10* (2013.01); *C09J 2203/326* (2013.01); *C09J 2205/102* (2013.01); *C09J 2205/11* (2013.01); *C09J 2463/00* (2013.01); *C09J 2467/006* (2013.01); *H01L 2224/2929* (2013.01); *H01L 2924/0665* (2013.01); *H01L 2924/07811* (2013.01); *H01L 2924/15788* (2013.01); *Y10T 428/2438* (2015.01); *Y10T 428/24364* (2015.01); *Y10T 428/2984* (2015.01)

(56) References Cited

U.S. PATENT DOCUMENTS

| | | |
|---|---|---|
| 2002/0159862 A1 | 10/2002 | Ertel et al. |
| 2004/0014860 A1 | 1/2004 | Meier et al. |
| 2004/0234763 A1 | 11/2004 | Saito |
| 2008/0131685 A1 | 6/2008 | Lee et al. |
| 2010/0104836 A1* | 4/2010 | Kobayashi ............. B43M 11/06 428/211.1 |
| 2010/0264553 A1 | 10/2010 | Wainerdi et al. |
| 2013/0053497 A1* | 2/2013 | Tully ........................ C09J 4/00 524/417 |
| 2013/0295098 A1 | 11/2013 | Wu et al. |

FOREIGN PATENT DOCUMENTS

| | | |
|---|---|---|
| EP | 0512546 A1 | 11/1992 |
| JP | S5917158 A | 1/1984 |
| JP | H03236297 A | 10/1991 |
| JP | H05119337 A | 5/1993 |
| JP | H05235096 A | 9/1993 |
| JP | 2004525007 A | 8/2004 |
| JP | 2005336358 A | 12/2005 |
| JP | 2008027676 A | 2/2008 |
| JP | 2009030060 A | 2/2009 |
| KR | 20080097874 A | 11/2008 |
| WO | 0218499 A1 | 3/2002 |

OTHER PUBLICATIONS

Chinese Office Action dated Jul. 30, 2013, Application No. 201210546247.4, Issue Serial No. 2013072500864930, Applicant BOE Technology Group Co., Ltd.; Chengdu BOE Optoelectronics Technology Co., Ltd., 3 Pages.

Extended European Search Report dated Mar. 17, 2014, Application No. 13196097.3-1302, Applicant Boe Technology Group Co., Ltd., et al., 7 pages.

Korean Office Action dated Mar. 19, 2015, Application No. 10-2013-0155560, Applicant Boe Technology Group Ltd., et al., 5 pages.

First Office Action for Japanese Application No. 2013-249119, dated Jun. 12, 2017, 4 Pages.

* cited by examiner

1

ANISOTROPIC CONDUCTIVE ADHESIVE FILM AND ELECTRONIC DEVICE

CROSS-REFERENCE TO RELATED APPLICATIONS

This application claims priority to Chinese application No. 201210546247.4, filed Dec. 14, 2012, entitled with "Anisotropic Conductive Adhesive Film and Electronic Device", which is hereby incorporated by reference in its entirety.

TECHNICAL FIELD

The present invention relates to the technical field of microelectronic packaging, and in particular, to an anisotropic conductive adhesive film and an electronic device.

BACKGROUND

In recent years, electronic display technologies, for example, liquid crystal display, electroluminescence technology, touch-screen technology and so on, develop rapidly, and one of the key technologies thereof is the connection between the drive circuit and the tin indium oxide on glass. An anisotropic conductive adhesive film (ACAF) has an apparent difference between the resistance in the Z-axis electrical conduction direction and that in the XY insulating plane, so that line connection of a fine microelectronic apparatus can be achieved. For example, the connection may be a connection between a liquid crystal glass and a flexible circuit, between a liquid crystal glass and an integrated circuit or between a flexible circuit and an integrated circuit. The anisotropic conductive adhesive films mainly used in the current market all contain a thermosetting resin, and thus electrical conduction and connection of a microelectronic apparatus can only be achieved via a high-temperature pressing.

The process for applying thermosetting anisotropic conductive adhesive film requires use of a temperature of 60° C. to 100° C., and the temperature for pressfitting and curing is required to be in the range of from 150° C. to 220° C. to ensure the quality of electrically connecting all apparatus. However, a high temperature tends to cause the deformation of the microelectronic apparatus, thereby causing the malposition or short circuit of a fine connecting line and further affecting the product quality and the long-term reliability.

Thus it can be seen that there exists the following problem in the prior art: when a thermosetting anisotropic conductive adhesive is employed for packaging and electrical connecting, the deformation of the microelectronic apparatus due to high temperature tends to cause a problem of a fine connecting line.

SUMMARY

Aim at the above problem existed in the prior art, the object of the invention is to provide an anisotropic conductive adhesive film and an electronic device. The problem of the prior art is as follows: when a thermosetting conductive glue is employed for packaging and electrical connecting, the deformation of the microelectronic apparatus due to high temperature tends to cause a problem of a fine connecting line.

An embodiment according to the present invention provides an anisotropic conductive adhesive film, which comprises a base film and microcapsule structures, wherein the microcapsule structures are set on the base film, and each of the microcapsule structures comprises a metallic conductive particle, a normal-temperature curable macromolecular polymer coated on the outside of the metallic conductive particle and a microcapsule wall coated on the outside of the macromolecular polymer, and an adhesive glue is adhered to the external surface of the microcapsule wall.

Moreover, the microcapsule structure is in the shape of a drum, and the plane of the drum rests on the base film.

Moreover, a layer of reticular macromolecular polymer is set on the base film, and the microcapsule structure is set on the reticular macromolecular polymer.

Moreover, the anisotropic conductive adhesive film further comprises a protective film covering the microcapsule structure.

Moreover, the material constituting the base film includes polyethylene terephthalate.

Moreover, the metallic conductive particle is constituted of a metal; preferably, the metallic conductive particle is constituted of gold, nickel or copper.

Moreover, the diameter of the metallic conductive particle is in the range of from 1 µm to 20 µm.

Moreover, the materials of the normal-temperature curable macromolecular polymer include bisphenol A epoxy resin and a room-temperature fast curing agent.

Moreover, the material constituting the microcapsule wall includes epoxy resin, paraffin, gelatin or polyurethane.

Moreover, the reticular macromolecular polymer includes silane crosslinked polyethylene.

One embodiment of the invention further provides an electronic device, wherein the electrical connection between different components in the electronic device is achieved by pressfitting the microcapsule structures in the above anisotropic conductive adhesive film.

A metallic conductive particle and a normal-temperature curable macromolecular polymer are used as the core material of the anisotropic conductive adhesive film and a microcapsule structure is used as the wall material of the anisotropic conductive adhesive film. When the anisotropic conductive adhesive film is used, the microcapsule structure is destroyed by pressurizing, the conductive particle and the normal-temperature curable macromolecular polymer contained inside the microcapsule wall leak out, and the normal-temperature curable macromolecular polymer after being leaked out is cured, so that electrical conduction and connection of a microelectronic apparatus may be achieved at normal temperature via the anisotropic conductive adhesive film.

The present invention will be more clearly understood from the description of preferred embodiments as set forth below, with reference to the accompanying drawings.

DETAILED DESCRIPTION

Figure 1:
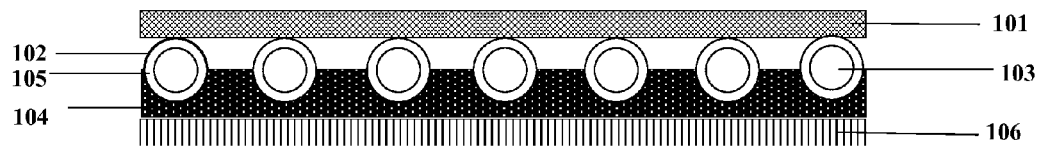
FIG. 1 is a sectional view of an anisotropic conductive adhesive film according to one embodiment of the invention.

As required, detailed embodiments are disclosed herein. However, it is to be understood that the disclosed embodiments are merely exemplary and that various and alternative forms may be employed. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

In order to make the technical problems to be solved, the technical solutions and the advantages according to the embodiments of the present invention more apparent, a detailed description will be given below in conjunction with the drawings and specific embodiments.

One embodiment of the present invention provides an anisotropic conductive adhesive film, which includes: a base film; and a microcapsule structure.

The base film mainly is made of polyethylene terephthalate (PET), and due to its good electric insulation, abrasive resistance and good physical-mechanical properties, the adherence and the corresponding packaging of the anisotropic conductive adhesive film may be ensured.

The microcapsule structure mainly includes a metallic conductive particle, a normal-temperature curable macromolecular polymer, a microcapsule wall and an adhesive glue adhered to the external surface of the microcapsule wall.

The metallic conductive particle may be made of a metal material such as Au, Ni and Cu, etc. Its diameter may be designed according to the requirement in the application field of the anisotropic conductive adhesive film, and usually in the range of from about 1 μm to about 20 μm.

The normal-temperature curable macromolecular polymer mainly employs bisphenol A epoxy resin plus a room-temperature fast curing agent. Since it can be cured quickly at normal temperature and has a strong cohesive force, it may provide the cohesive force required when a microelectronic apparatus and a glass are pressfitted. For example, the room-temperature fast curing agent is ethyl α-cyanoacrylate, which is the ingredient of so-called 502 glue. When the normal-temperature curable macromolecular polymer is put inside a microcapsule wall in a specific environment, for example, in vacuum or in a dry inert gas atmosphere, it will not be cured; but after the microcapsule wall is broken, it will be cured quickly under the action of certain ingredients in the air, for example, a trace amount of aqueous vapor in the air.

The microcapsule wall employs epoxy resin, paraffin, gelatin or polyurethane, etc., as the wall material, and employs a conductive particle and a normal-temperature curable macromolecular polymer as the core material. When it is pressurized, the core material is released from the wall material.

The adhesive glue adhered to the external surface of the microcapsule is a glue with a weak cohesiveness, so long as that the microcapsule can be fixed to other part such as a reticular macromolecular polymer. For example, the glue with a weak cohesiveness may be a removable acrylic latex such as AR600, a restickable solvent-based glue such as SR101 and SR106, and a removable solvent glue such as SR107, which may be used as required.

Because a metallic conductive particle and a normal-temperature curable macromolecular polymer are employed as the core material and a microcapsule structure is employed as the wall material, when in use, the microcapsule wall is destroyed by pressurizing, the conductive particle and the normal-temperature curable macromolecular polymer contained inside the microcapsule wall leak out, and the normal-temperature curable macromolecular polymer leaked out is cured, so that electrical conduction and connection of a microelectronic apparatus can be achieved at normal temperature via the anisotropic conductive adhesive film.

The anisotropic conductive adhesive film further includes a reticular macromolecular polymer structure and a protective film.

The reticular macromolecular polymer structure is made of silane crosslinked polyethylene, and mainly used to separate the microcapsule containing the conductive particle from each other and ensure single-layer tiling, and thereby avoiding the phenomenon of the stacking of conductive particles.

The protective film is mainly made of transparent polyethylene terephthalate, and protects the anisotropic conductive adhesive film from being contaminated and ensures to easily package and store.

The anisotropic conductive adhesive film according to the embodiments of the invention further solves the following problems of the prior art, that is, thermosetting anisotropic conductive adhesive film requires to be stored in a low temperature condition, generally, the activity and adherence thereof can only be guaranteed at the temperature of from −5° C. to 10° C., and once it leaves the low temperature environment, it must be used up quickly due to the rising of the temperature; otherwise, the curing activity of the adhesive film will be influenced, thereby the quality of apparatus connection will be influenced. However, the anisotropic conductive adhesive film according to one embodiment of the invention may be stored at normal temperature. When in use, it only needs to be cured by pressurizing, the contact resistance in Z-axis direction is small, and the XY plane may be guaranteed to be insulating by employing a reticular structure, no phenomenon of the stacking of particles occurs, the features of the circuit will not be destroyed, and the packaging or connecting of a microelectronic line will be quickened, thereby the production efficiency will be improved, and it is applicable for mass production and pipeline operation.

For better understanding the invention, it will be further illustrated in conjunction with the drawings.

As shown in FIG. 1, it is a sectional view of the anisotropic conductive adhesive film according to one embodiment of the invention, wherein the anisotropic conductive adhesive film includes: a protective film 101, a microcapsule wall 102, a metallic conductive particle 103, a reticular macromolecular polymer 104, a normal-temperature curable macromolecular polymer 105 and a base film 106. First of all, a metallic conductive particle 103 with a certain diameter is manufactured, then a normal-temperature curable macromolecular polymer 105 and the metallic conductive particle 103 are injected into a microcapsule wall 102 to form an independent microcapsule structure. A reticular macromolecular polymer structure 104 is manufactured by using a mould 111 via a technology similar to injection moulding, and then a microcapsule structure monomer with a surface viscosity is embedded into the reticular macromolecular polymer 104. The embedded microcapsule structure and the reticular macromolecular polymer 104 are totally adhered to the bottommost base film 106, and finally, a protective film 101 is covered topmost.

The anisotropic conductive adhesive film according to one embodiment of the invention is also applicable for the connection of fine microelectronic apparatuses in other fields. The connection of the electrical features of a microelectronic apparatus and the connection strength thereof may be ensured so long as a pressure device can provide a certain high pressure to destroy the microcapsule structure when in use.

Figure 2:
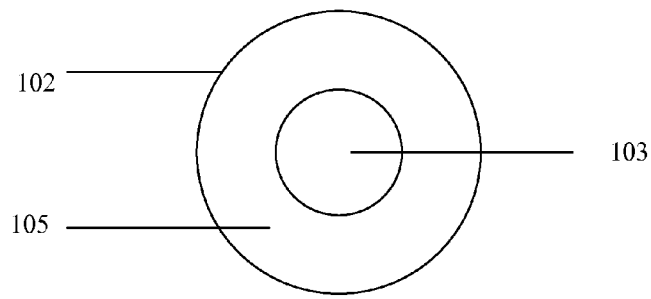
FIG. 2 shows the microcapsule structure according to one embodiment of the invention.

As shown in FIG. 2, it is a structural representation of a microcapsule structure, which includes a metallic conductive particle 103, a normal-temperature curable macromolecular polymer 105 and a microcapsule wall 102. The metallic conductive particle 103 is wrapped by the normal-temperature curable macromolecular polymer 105 to form the core material, and an adhesive glue is adhered to the external surface of the microcapsule wall 102.

Figure 3:
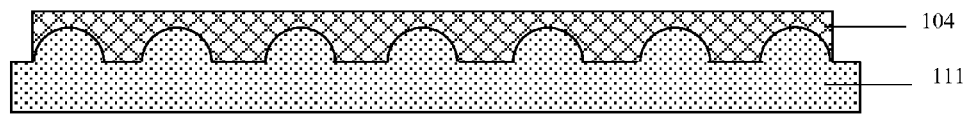
FIG. 3 is a sectional view of the reticular macromolecular polymer according to one embodiment of the invention and a manufacturing mould thereof.

As shown in FIG. 3, it is a sectional view showing the manufacturing of the reticular macromolecular polymer 104. A reticular macromolecular polymer 104 with hemispherical recesses is manufactured by using a reticular macromolecular polymer manufacturing mould 111 with hemispherical protrusions.

Figure 4:
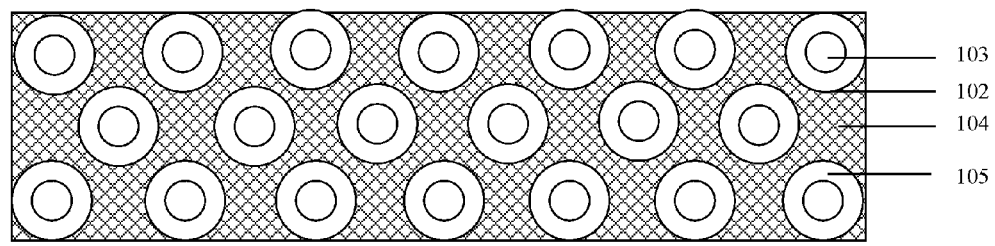
FIG. 4 is an overall top view showing that a microcapsule according to one embodiment of the invention is embedded into a reticular macromolecular polymer.

As shown in FIG. 4, it is an overall top view of a microcapsule structure embedded into the reticular macromolecular polymer 104. A plurality of microcapsule structures are embedded into the reticular macromolecular polymer 104.

Figure 5:
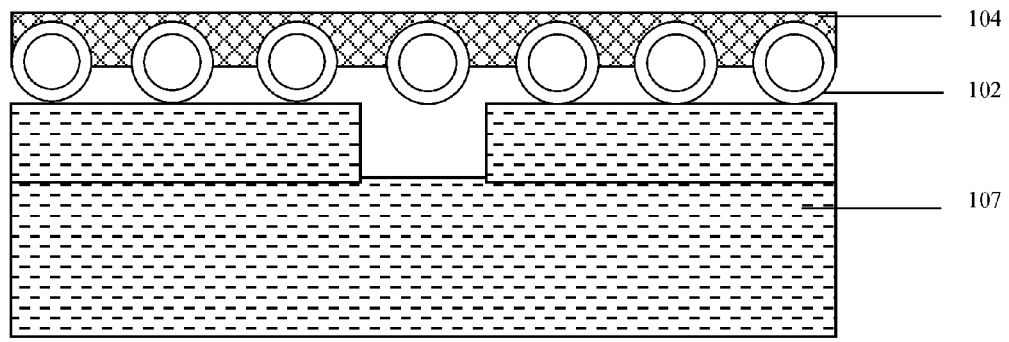
FIGS. 5, 6 and 7 are sectional views showing that an anisotropic conductive adhesive film according to one embodiment of the invention is used to stick a first substrate to a second substrate.
Figure 6:
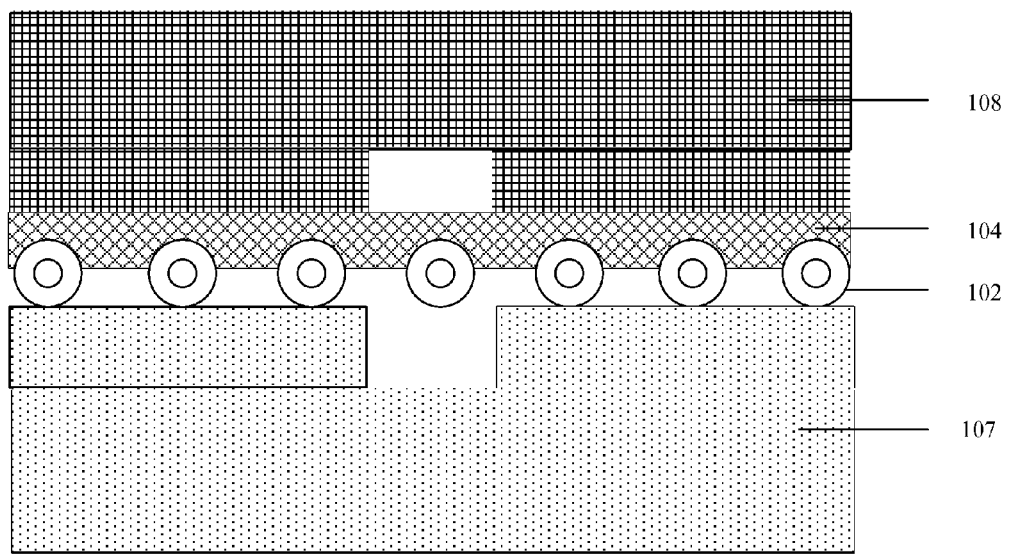
Figure 7:
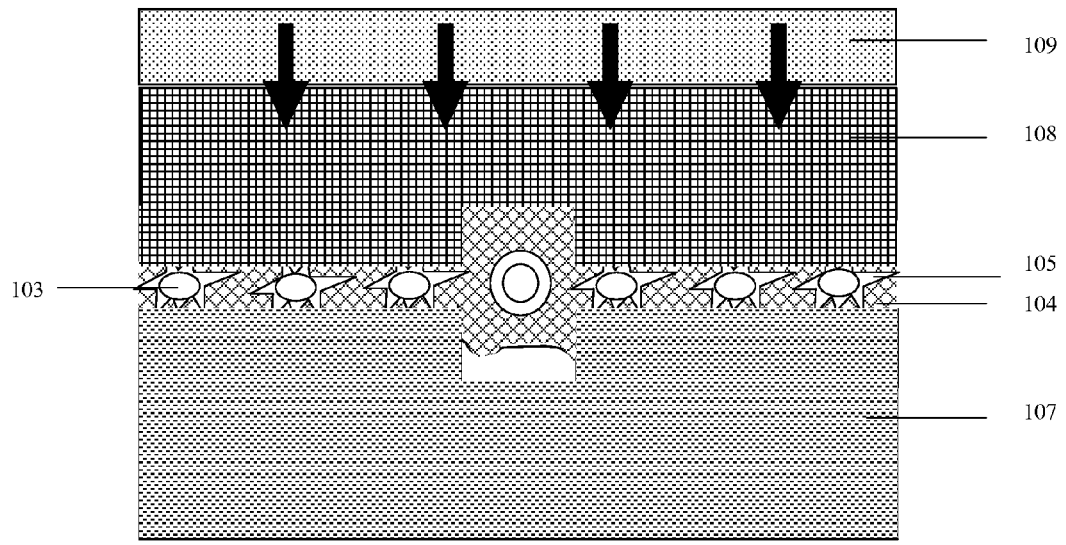

As shown in FIGS. 5, 6 and 7, it shows the principle of use of anisotropic conductive adhesive film according to one embodiment of the invention. When the anisotropic conductive adhesive film according to one embodiment of the invention is used, a conventional anisotropic conductive adhesive film applying device is employed to first remove the protective film 101, then the anisotropic conductive adhesive film is cut into a required length through a cutting knife, and it is applied on the first substrate 107 by slightly pressurizing at normal temperature, and then the base film 106 is removed. The second substrate 108 is slightly applied on the anisotropic conductive adhesive film after alignment, then the microcapsule wall 102 is destroyed at a high pressure, the conductive particle 103 and the normal-temperature curable macromolecular polymer 105 contained inside leak out, and the conductive particle 103 normally connects the electrical members between the first substrate 107 and the second substrate 108. After the normal-temperature curable macromolecular polymer is cured, an adhesive strength is kept between the first substrate 107 and the second substrate 108. By use of the anisotropic conductive adhesive film according to the invention the invention, mass production or pipeline production can be achieved.

Figure 8:
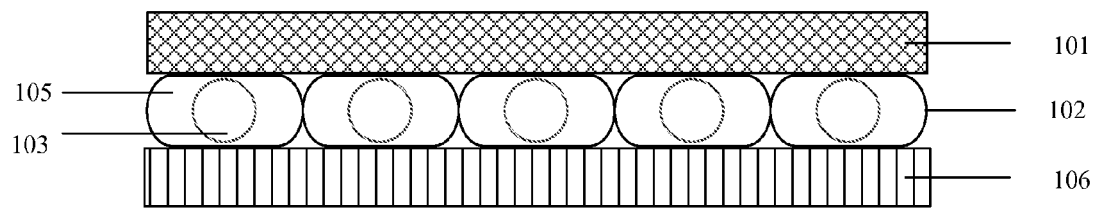
FIG. 8 is a sectional view of the microcapsule in the shape of a drum according to one embodiment of the invention.
Figure 9:
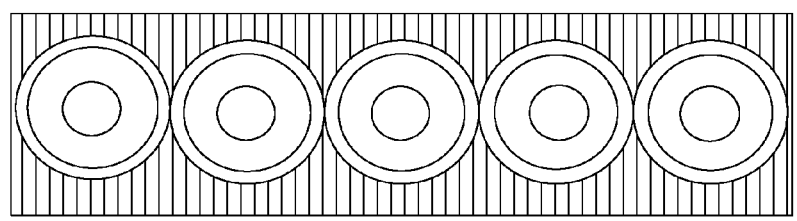
FIG. 9 is a top view of a microcapsule in the shape of a drum according to one embodiment of the invention.

Alternatively, no reticular macromolecular polymer 104 may be used; instead, the microcapsule will be used directly. However, the design of the microcapsule needs to be changed, and the microcapsule is directly set on the base film 106, as shown in FIG. 8, the microcapsule is in the shape of a drum, wherein the horizontal plane is parallel to the base film 106.

One embodiment of the invention further provides an electronic device, wherein electrical connection between different components in the electronic device is achieved by pressfitting the microcapsule structure in the above anisotropic conductive adhesive film.

Finally, it should be noted that the above embodiments are only used to illustrate the technical solutions of the invention rather than limit the scope thereof. Although the invention has been illustrated in detail by referring to the preferred embodiments, it should be understood by a person skilled in the art that various modifications or substitutions may be made to the technical solutions of the invention, without departing from the spirit and scope of the invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An anisotropic conductive adhesive film comprising:
a base film; and
microcapsule structures set on the base film, with each of the microcapsule structures comprising a metallic conductive particle, a normal-temperature curable macromolecular polymer coated on the outside of the metallic conductive particle and a microcapsule wall coated on the outside of the macromolecular polymer, with an adhesive glue adhered to the external surface of the microcapsule wall,
wherein the normal-temperature curable macromolecular polymer comprises bisphenol A epoxy resin and a room-temperature fast curing agent, the room-temperature fast curing agent is a curing agent that provides a fast cure for bisphenol A epoxy under the action of a trace amount of aqueous vapor in the air, and the room-temperature fast curing agent comprises ethyl α-cyanoacrylate.

2. The anisotropic conductive adhesive film according to claim 1, wherein the microcapsule structure is in the shape of a drum, and the plane of the drum shape rests on the base film.

3. The anisotropic conductive adhesive film according to claim 1, wherein a layer of reticular macromolecular polymer is set on the base film, and the microcapsule structure is set on the reticular macromolecular polymer.

4. The anisotropic conductive adhesive film according to claim 1, further comprising a protective film covering the microcapsule structure.

5. The anisotropic conductive adhesive film according to claim 1, wherein the material constituting the base film includes polyethylene terephthalate.

6. The anisotropic conductive adhesive film according to claim 1, wherein the metallic conductive particle is made of a metal, and the diameter of the metallic conductive particle is in the range of from 1 μm to 20 μm.

7. The anisotropic conductive adhesive film according to claim 1, wherein the metallic conductive particle is made of gold, nickel or copper.

8. The anisotropic conductive adhesive film according to claim 1, wherein the material constituting the microcapsule wall includes epoxy resin, paraffin, gelatin or polyurethane.

9. The anisotropic conductive adhesive film according to claim 3, wherein the reticular macromolecular polymer includes silane crosslinked polyethylene.

10. An electronic device, wherein electrical connection between different components in the electronic device is achieved by pressfitting microcapsule structures in an anisotropic conductive adhesive film, wherein the anisotropic conductive adhesive film comprising:
   a base film; and
   microcapsule structures set on the base film, with each of the microcapsule structures comprising a metallic conductive particle, a normal-temperature curable macromolecular polymer coated on the outside of the metallic conductive particle and a microcapsule wall coated on the outside of the macromolecular polymer, with an adhesive glue adhered to the external surface of the microcapsule wall,
   wherein the normal-temperature curable macromolecular polymer consists of bisphenol A epoxy resin and a room-temperature fast curing agent, the room-temperature fast curing agent is a curing agent that provides a fast cure for bisphenol A epoxy under the action of a trace amount of aqueous vapor in the air, and the room-temperature fast curing agent comprises ethyl α-cyanoacrylate.

11. An anisotropic conductive adhesive film comprising:
   a base film; and
   microcapsule structures set on the base film, with each of the microcapsule structures comprising a metallic conductive particle, a normal-temperature curable macromolecular polymer encapsulating the metallic conductive particle and a microcapsule wall coated on the outside of the macromolecular polymer, with an adhesive glue adhered to the external surface of the microcapsule wall,
   wherein the normal-temperature curable macromolecular polymer comprises a mixture of bisphenol A epoxy resin and ethyl α-cyanoacrylate.

12. The electronic device according to claim 10, wherein the microcapsule structure is in a shape of a drum, and a plane of the drum shape rests on the base film.

13. The electronic device according to claim 10, wherein a layer of reticular macromolecular polymer is set on the base film, and the microcapsule structure is set on the reticular macromolecular polymer.

14. The electronic device according to claim 10, further comprising a protective film covering the microcapsule structure.

15. The electronic device according to claim 10, wherein the material constituting the base film includes polyethylene terephthalate.

16. The electronic device according to claim 10, wherein the metallic conductive particle is made of a metal, and the diameter of the metallic conductive particle is in the range of from 1 μm to 20 μm.

17. The electronic device according to claim 10, wherein the metallic conductive particle is made of gold, nickel or copper.

18. The electronic device according to claim 10, wherein the material constituting the microcapsule wall includes epoxy resin, paraffin, gelatin or polyurethane.

19. The electronic device according to claim 13, wherein the reticular macromolecular polymer includes silane cross-linked polyethylene.

* * * * *